(12) United States Patent
Lu et al.

(10) Patent No.: US 9,536,577 B2
(45) Date of Patent: Jan. 3, 2017

(54) DATA MOVEMENT IN MEMORY DEVICES

(71) Applicant: Intel Corporation, Santa Clara, CA (US)

(72) Inventors: Shih-Lien Lu, Portland, OR (US); Ying-Chen Lin, New Taipei (TW); Chia-Lin Yang, Taipei (TW)

(73) Assignee: Intel Corporation, Santa Clara, CA (US)

( * ) Notice: Subject to any disclaimer, the term of this patent is extended or adjusted under 35 U.S.C. 154(b) by 351 days.

(21) Appl. No.: 14/037,745

(22) Filed: Sep. 26, 2013

(65) Prior Publication Data

US 2015/0085589 A1    Mar. 26, 2015

(51) Int. Cl.
*G11C 7/06* (2006.01)
*G11C 7/08* (2006.01)
*G11C 7/10* (2006.01)

(52) U.S. Cl.
CPC .............. *G11C 7/08* (2013.01); *G11C 7/065* (2013.01); *G11C 7/1045* (2013.01)

(58) Field of Classification Search
CPC .......... G11C 7/08; G11C 7/065; G11C 7/1045
USPC ....................... 365/189.17, 189.05
See application file for complete search history.

(56) References Cited

U.S. PATENT DOCUMENTS

| | | | | |
|---|---|---|---|---|
| 5,715,423 A | * | 2/1998 | Levy ................... | G11C 16/102 711/103 |
| 6,449,198 B1 | * | 9/2002 | Hamade ............... | G11C 7/1048 365/189.14 |
| 2006/0117155 A1 | * | 6/2006 | Ware .................... | G11C 7/1006 711/163 |
| 2006/0143428 A1 | * | 6/2006 | Noda ...................... | G06F 7/785 712/10 |
| 2008/0037356 A1 | * | 2/2008 | Kajigaya .................. | G11C 8/10 365/230.03 |
| 2012/0296883 A1 | * | 11/2012 | Ganesh ............. | G06F 17/30315 707/693 |
| 2013/0275836 A1 | * | 10/2013 | Inada .................. | G06F 11/1068 714/773 |
| 2014/0177347 A1 | * | 6/2014 | Chatterjee ........... | G11C 11/4076 365/189.05 |

* cited by examiner

*Primary Examiner* — Toan Le
(74) *Attorney, Agent, or Firm* — Thorpe North & Western, LLP

(57) ABSTRACT

Apparatus, systems, and methods for data movement in a memory device are described. In one embodiment, a memory controller comprises logic to move a row of data from a first row of a memory in a first section of a memory device to a second row of memory in a second section of the memory device without passing the data through a communication interface. Other embodiments are also disclosed and claimed.

20 Claims, 14 Drawing Sheets

DATA MOVEMENT IN MEMORY DEVICES

FIELD

The present disclosure generally relates to the field of electronics. More particularly, some embodiments of the invention generally relate to data movement in memory devices.

BACKGROUND

Many electronic devices include memory devices, e.g., Dynamic Random Access Memory (DRAM) devices, which are structured as a matrix of rows and columns Data is typically stored in such memory devices in a row, with current modern Double Data Rate (DDR) DRAM devices having up to 16K-bits in a row (i.e., a page). These electronic devices use these memory devices to construct physical memory space of the underlining computing system. In some instances a computing system may need to copy (or move) a block of memory within its memory space. A typical block size is the operating system page size which is typically at least 4 Kilo Bytes (KB). However, most DRAM devices used to implement the memory space are designed with relatively narrow (e.g., 4-bit, 8-bit, 16-bit) Input/Output (I/O) interfaces. Moreover the communication interface width between DRAM Dual In Line Memory Modules (DIMMs) (a group of DRAM devices) and processors is standardized and also narrow as well (64 bits). Thus, in existing architectures moving a large block of data (such as a page in the operating system) in physical memory space requires multiple cycles which step through sequential addresses in a row via the communication interface used to communicate with the external physical memory devices. Accordingly, efficient techniques to move data from one row to another within a memory device may find utility, e.g., in memory systems.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Figure 1:
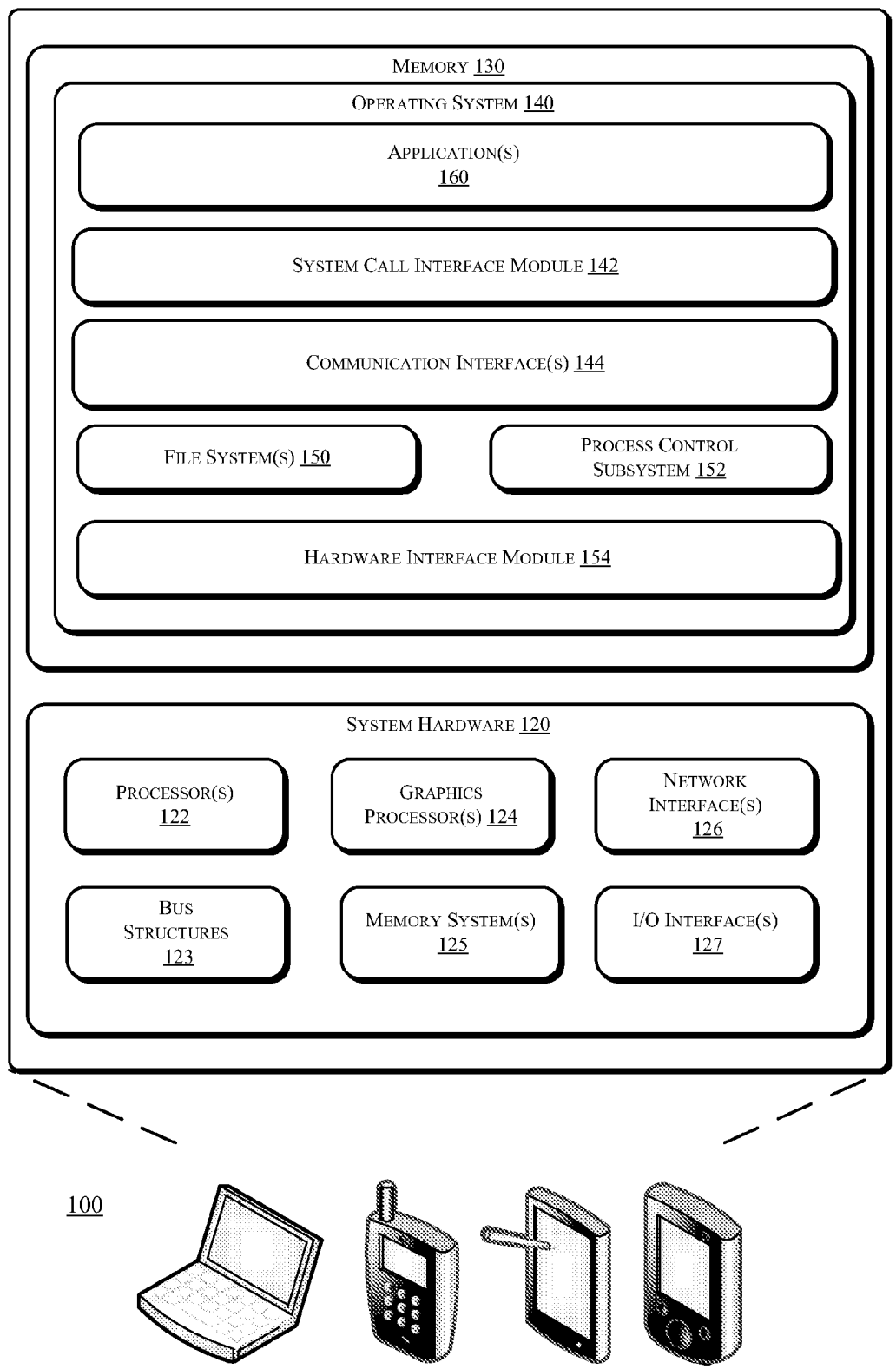
FIG. 1 is a schematic, block diagram illustration of components of an electronic device which may be adapted to implement data movement in memory devices in accordance with various embodiments discussed herein.

FIG. 1 is a schematic illustration of an exemplary electronic device 100 which may be adapted to implement data movement in memory devices as described herein, in accordance with some embodiments. In various embodiments, the electronic device 100 may be embodied as a personal computer, a laptop computer, a personal digital assistant, a mobile telephone, an entertainment device, a tablet computer, an electronic reader, or another computing device.

The electronic device 100 includes system hardware 120 and memory 130, which may be implemented as random access memory and/or read-only memory. System hardware 120 may include one or more processors 122, bus structures 123, one or more graphics processors 124, memory systems 125, network interfaces 126, and input/output interfaces 127. In one embodiment, processor 122 may be embodied as an Intel® Core2 Duo® processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Bus structures 123 connect various components of system hardware 120. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

Graphics processor(s) 124 may function as adjunct processor that manages graphics and/or video operations. Graphics processor(s) 124 may be integrated onto the motherboard of electronic device 100 or may be coupled via an expansion slot on the motherboard.

Memory systems 125 may comprise local memory, e.g., cache memory, one or more forms of volatile memory and nonvolatile memory, as described below.

In one embodiment, network interface(s) 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/ GSM Association, Ver. 3.0.1, December 2002).

I/O interface(s) 127 may be implemented on one or more I/O devices, e.g., a display, a touch screen, one or more speakers, a keyboard, a mouse, a touchpad, or the like.

Memory 130 may store an operating system 140 for managing operations of electronic device 100. In one embodiment, operating system 140 includes a hardware interface module 154, e.g., one or more operating system device drivers, that provides an interface to system hardware 120. In addition, operating system 140 may include a file system 150 that manages files used in the operation of electronic device 100 and a process control subsystem 152 that manages processes executing on electronic device 100.

Operating system 140 may include (or manage) one or more communication interfaces 144 that may operate in conjunction with system hardware 120 to transceive data packets and/or data streams from a remote source. Operating system 140 may further include a system call interface module 142 that provides an interface between the operating system 140 and one or more application modules resident in memory 130. Operating system 140 may be embodied as a UNIX operating system or any derivative thereof (e.g., Linux, Solaris, etc.) or as a Windows® brand operating system, or other operating systems.

In some embodiments memory 130 may store one or more applications 160 which may execute on the one or more processors 122 under the supervision of operating system 140. The applications 160 may be embodied as logic instructions stored in a tangible, non-transitory computer readable medium (i.e., software or firmware) which may be executable on one or more of the processors 122. Alternatively, these applications may be embodied as logic on a programmable device such as a field programmable gate array (FPGA) or the like. Alternatively, these applications may be reduced to logic that may be hardwired into an integrated circuit.

Figure 2:
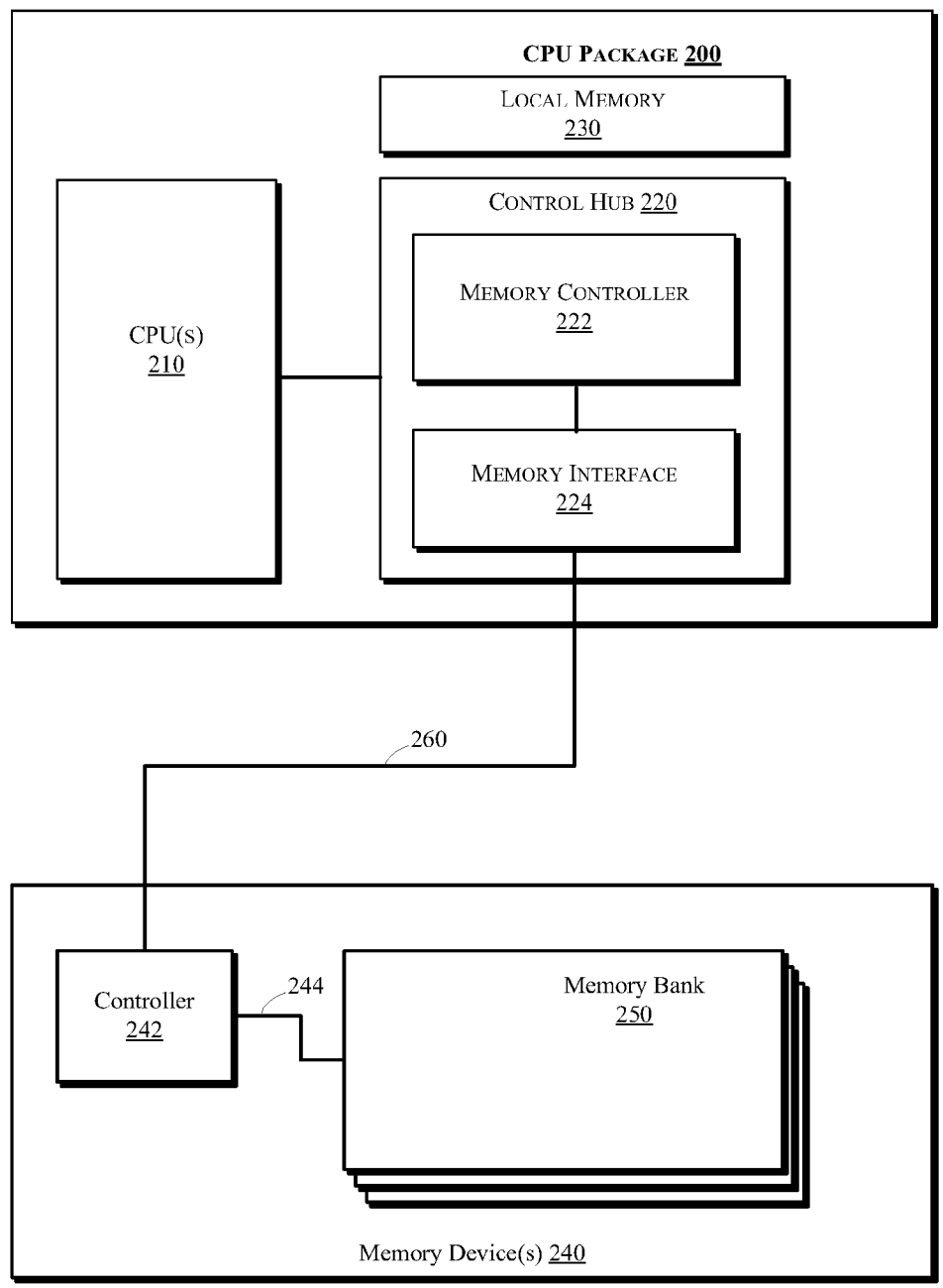
FIG. 2 is a schematic, block diagram illustration of components of apparatus to implement data movement in memory devices in accordance with various embodiments discussed herein.

FIG. 2 is a schematic, block diagram illustration of components of apparatus to implement data movement in memory devices in accordance with various embodiments discussed herein. Referring to FIG. 2, in some embodiments a central processing unit (CPU) package 200 which may comprise one or more CPUs 210 coupled to a control hub 220 and a local memory 230. Control hub 220 comprises a memory controller 222 and a memory interface 224.

Memory interface 224 is coupled to one or more remote memory devices 240 by a communication bus 260. Memory device 240 may comprise a controller 242 and one or more memory banks 250. In various embodiments, memory banks 250 may be implemented using dynamic random access memory (DRAM) memory, e.g., low-power double data rate (LPDDR) DRAM, Wide Input/Output (WIO) DRAM. By way of example, in some embodiments the memory device(s) 240 may comprise one or more direct in-line memory modules (DIMMs) coupled to a communication interface 244 which provides a communication link to controller 242. The specific configuration of the memory bank(s) 250 in the memory device(s) 240 is not critical.

Figure 3:
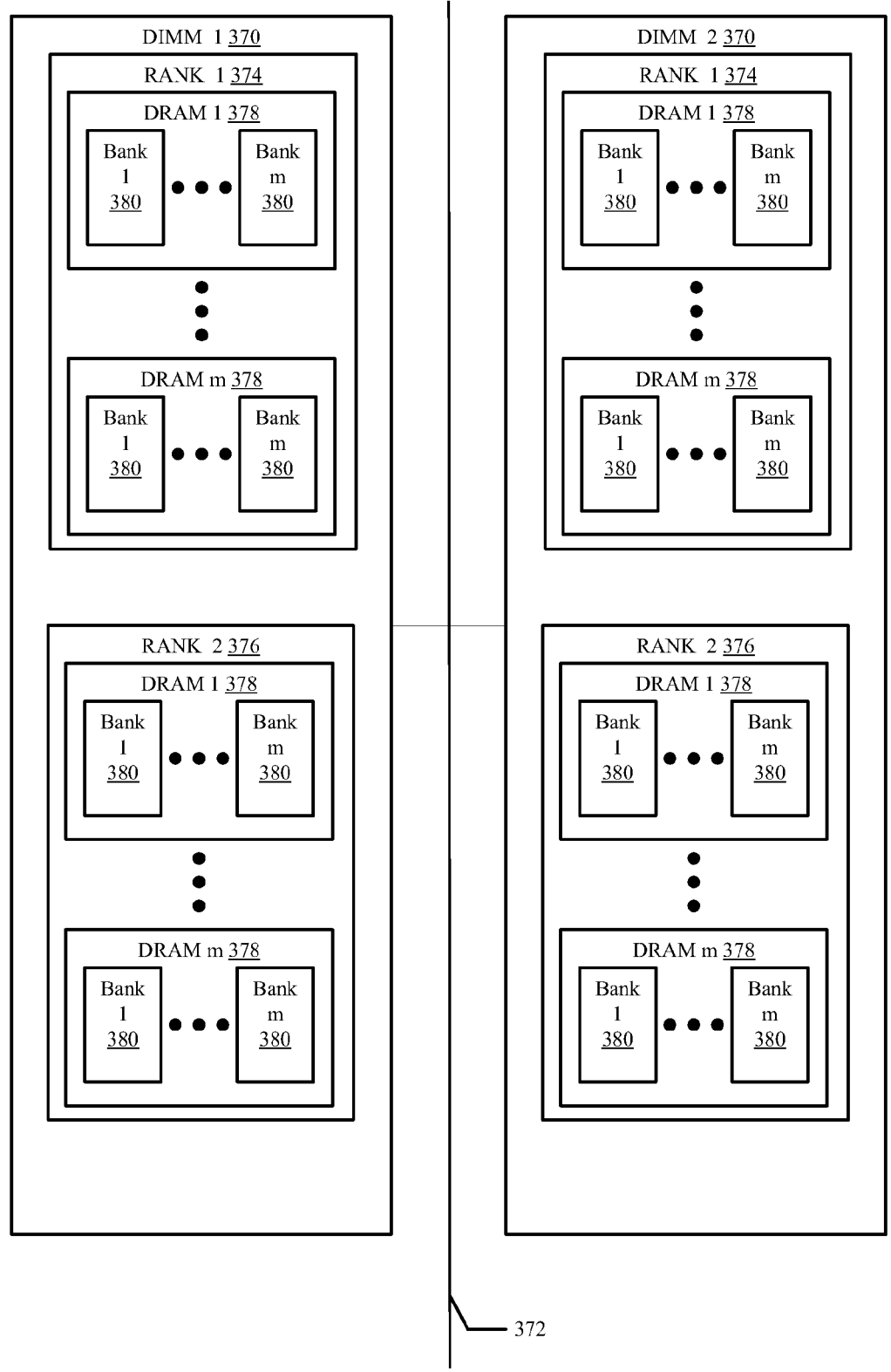
FIG. 3 is a schematic illustration of a memory in accordance with various embodiments discussed herein.

By way of example, referring to FIG. 3, in some embodiments the memory bank 250 may comprise one or more direct in-line memory modules (DIMMs) 370 coupled to a memory channel 372 which provides a communication link to memory controller 242. In the embodiment depicted in FIG. 3 each DIMM 370 comprises a first rank 374 and a second rank 376, each of which includes a plurality of DRAM devices (chips) 378. Each DRAM device comprises of multiple banks 380, each of which comprises multiple tiles, also referred to as sections, which are illustrated in greater detail in FIGS. 5A-5D. One skilled in the art will recognize that memory bank 250 may comprise more or fewer DIMMs 370, and more or fewer ranks per DIMM. Further, some electronic devices (e.g., smart phones, tablet computers, and the like) may comprise simpler memory systems comprised of one or more DRAMs.

In some embodiments logic in the controller 242 implements data movement in memory devices such as in DRAM modules 370. More particularly, in some embodiments logic in the memory controller 242 implements operations to move a row of data between a first a first row in a first section of a DRAM 378 to a second row in a second section of a DRAM 378 without moving the data through a communication interface such as interface 244 or the communication channel 372.

Operations implemented by controller 242 will be described with reference to FIGS. 4A-4B and FIGS. 5A-5D. Referring first to FIG. 5A, in some embodiments a memory device 500 may be embodied as a DRAM device analogous to the DRAM devices 378 depicted in FIG. 3. Memory device 500 may be subdivided into a plurality of sections. In the example illustrated in FIGS. 5A-5D two sections 510 and 520 of memory device 500 are depicted. It will be understood that in practice the memory device 500 may comprise more than two sections.

The first section 510 includes a plurality of rows 512A, 512B, 512C . . . 512M, 512N of memory. The rows may be referred to collectively herein by reference numeral 512. Each row 512 includes a plurality of memory cells 514, each of which comprises a transistor and a capacitor. The rows 512 are coupled to a signal line commonly referred to as a word line 518 and individual cells 514 are coupled to either an even bit line 516A or an odd bit line 516B, which may be referred to herein collectively by reference numeral 516. Word lines 518 and bit lines 516 may be coupled to controller 242 via communication interface 244.

Similarly, the second section 520 includes a plurality of rows 522A, 522B, 522C . . . 522M, 522N of memory. The rows may be referred to collectively herein by reference numeral 522. Each row 522 includes a plurality of memory cells 524, each of which comprises a transistor and a capacitor. The rows 522 are coupled to a signal line commonly referred to as a word line 528 and individual cells 524 are coupled to either an even bit line 526A or an odd bit line 526B, which may be referred to herein collectively by reference numeral 526. Word lines 528 and bit lines 526 may be coupled to controller 242 via communication interface 244.

A set of sense amplifiers 530A, 530B, 530C are positioned adjacent the first section 510 and the second section 520 of the memory device 500. Successive sets of sense amplifiers 530 are coupled to even and odd bit lines in an alternating fashion. In the example depicted in FIG. 5A the first set of sense amplifiers 530A are coupled to even bit lines 516B, the second set of sense amplifiers 530B are coupled to odd bit lines 516A, 526A. The third set of sense amplifiers 530C are coupled to even bit lines 526B. This alternating pattern may be repeated throughout the memory device 500.

Sections 510, 520 of the memory device 500 comprise at least one respective buffer row 540A, 540B, which may be referred to herein collectively by reference numeral 540. The buffer rows 540 have memory cells 544A, 544B, which may be referred to herein collectively by reference numeral 544, which have a slightly different structure than the other rows 518 in the section. The memory cells 544 are "double ported" in the sense that the buffer rows 540 have two word lines 518 and the respective memory cells 544 in the buffer rows 540 are coupled to both odd bit lines 516A, 526A and to odd bit lines 516B, 526B.

By way of example, existing DRAM chips commonly include between about 16 sections and 64 sections of memory, each of which comprises between about 64 rows and 512 rows of memory. The particular size of the memory device 500 or the respective sections 510, 520 are not critical.

Having described structural components of one example of a memory device 500, attention will now be turned to operations implemented by controller 242 to move data from a row 518 in the first section 510 of memory 500 to a row 528 in the second section 520 of memory 500. The methods described herein may be used to move data between rows in adjacent sections 510, 520 of a memory device without passing the data through a communication interface 244. Rather, the data is passed directly between sections 510, 520 of the memory device 500 via the sense amplifiers 530 and buffer rows 540.

Figure 4A:
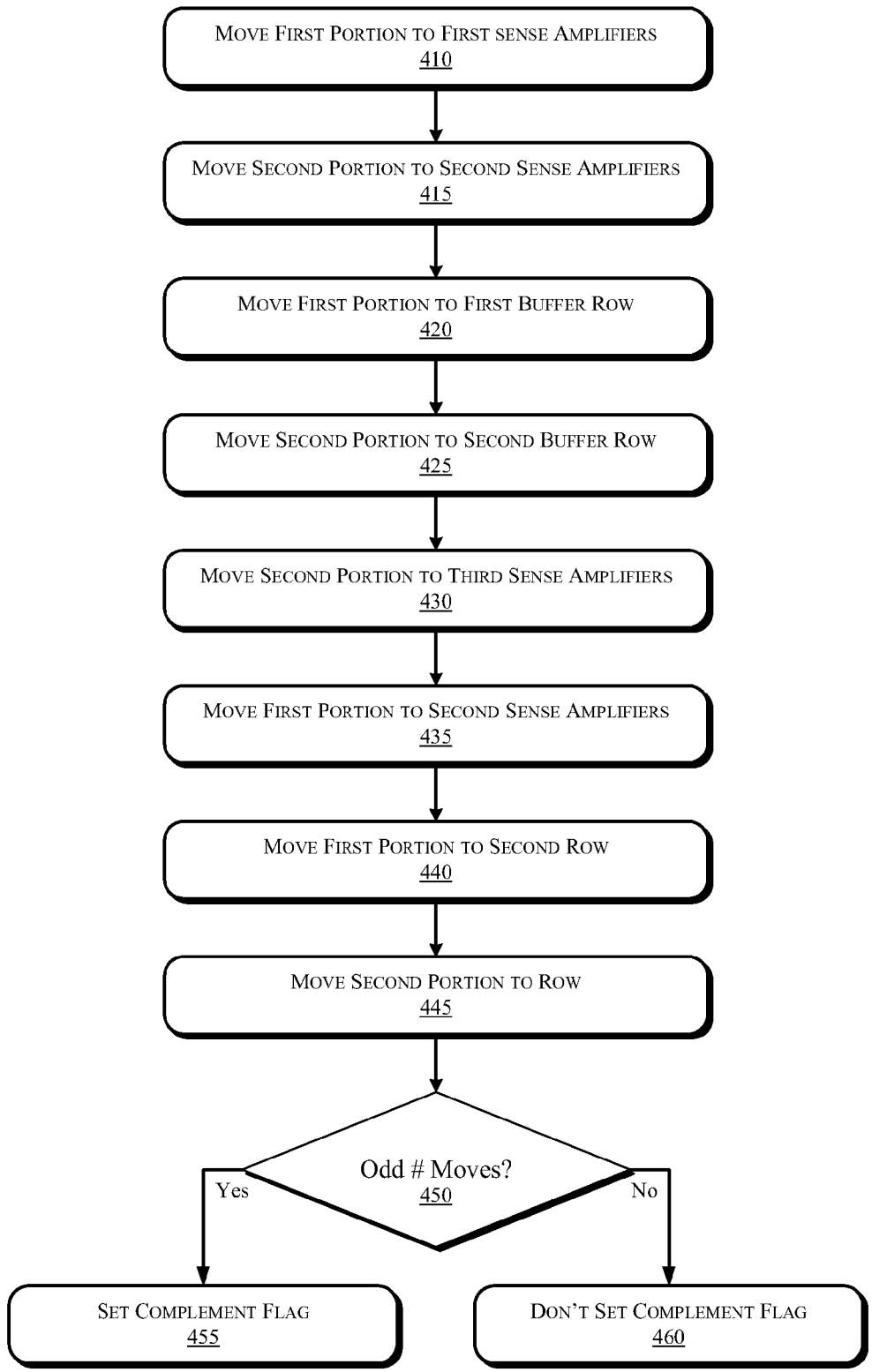
FIGS. 4A and 4B are flowcharts illustrating operations in a method to implement data movement in memory devices in accordance with various embodiments discussed herein.
Figure 5A:
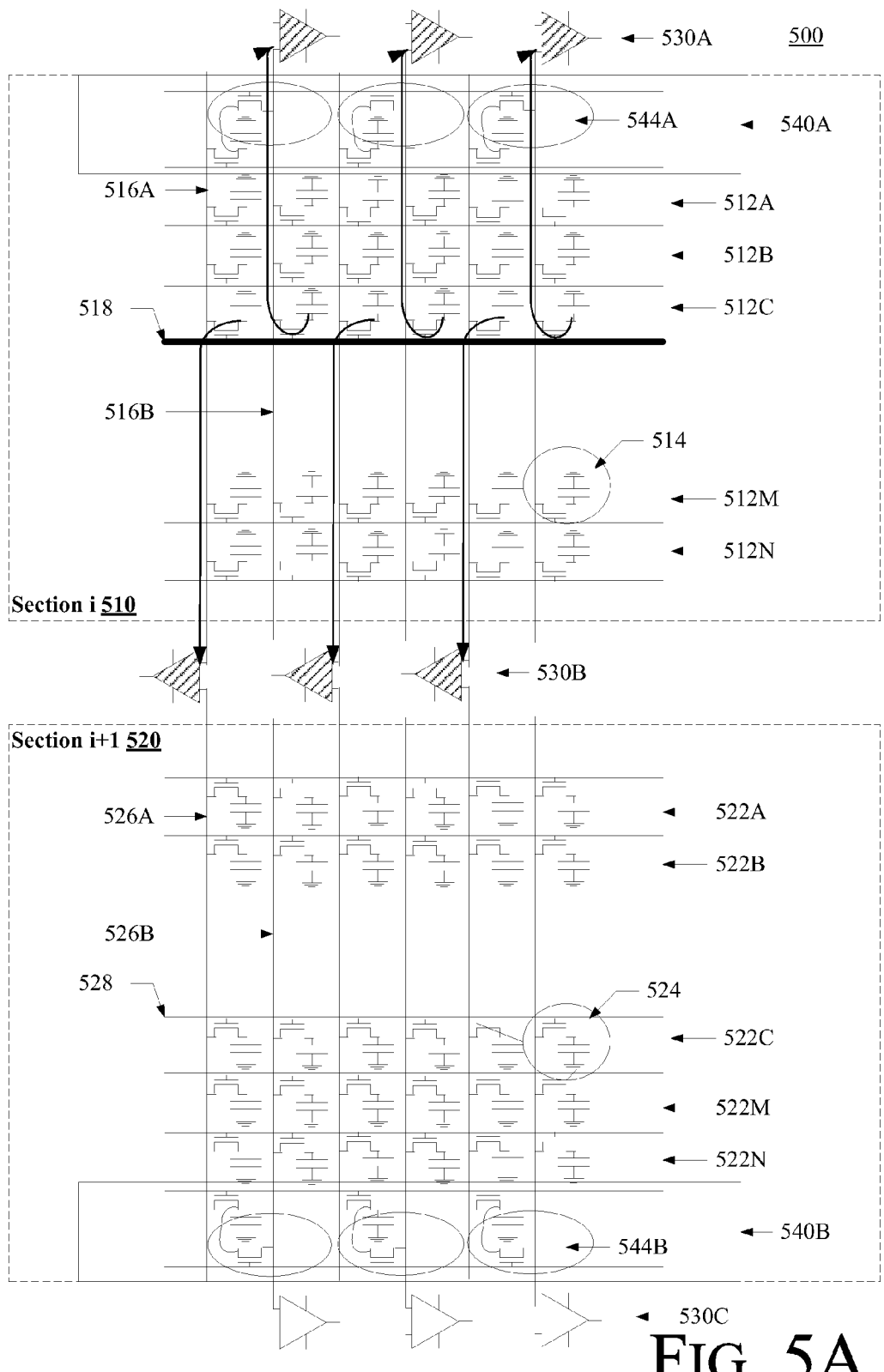
FIGS. 5A-5D are schematic illustrations of an example memory device while implementing operations to implement data movement in memory devices in accordance with various embodiments discussed herein.
Figure 5B:
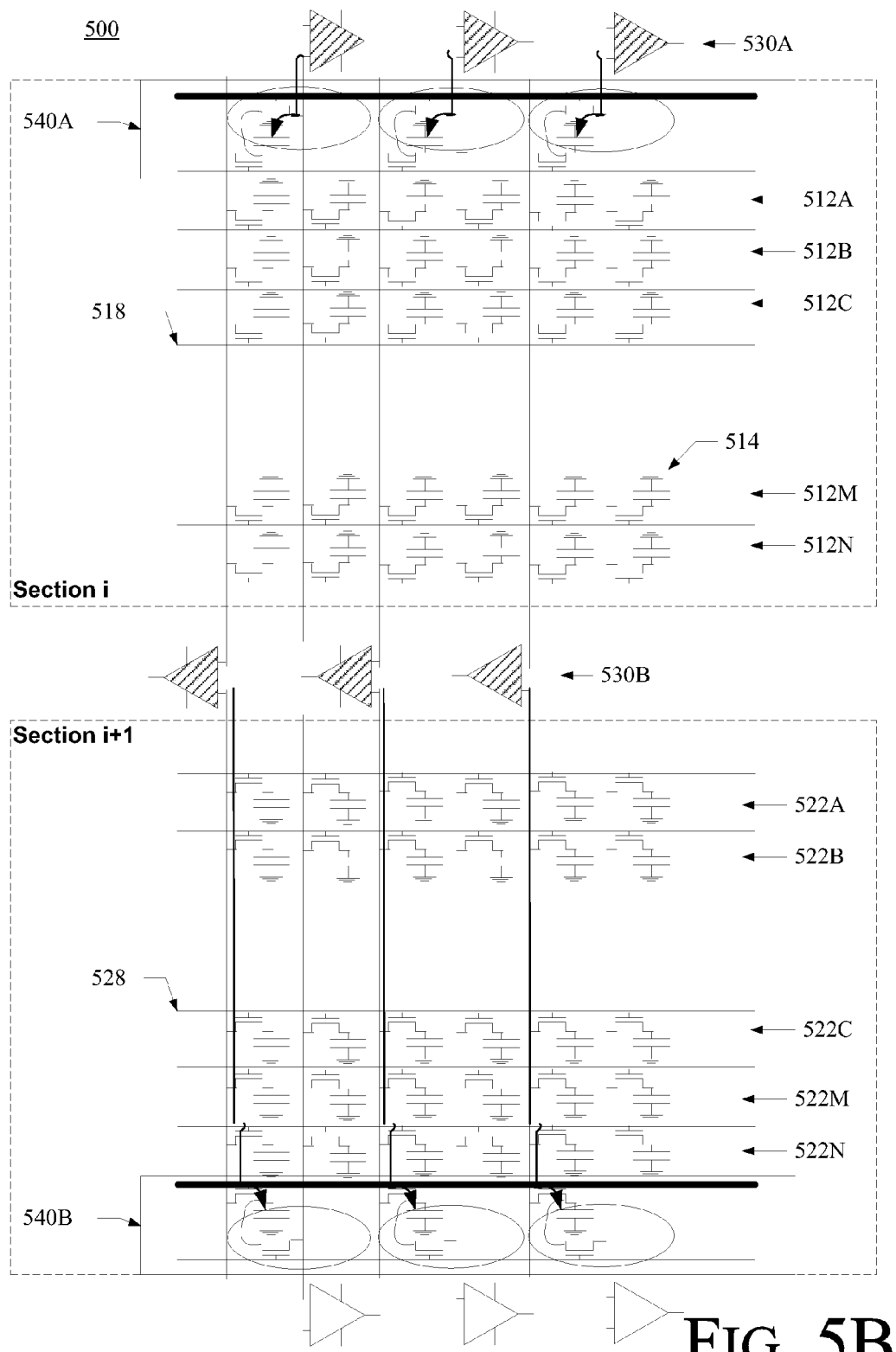
Figure 5C:
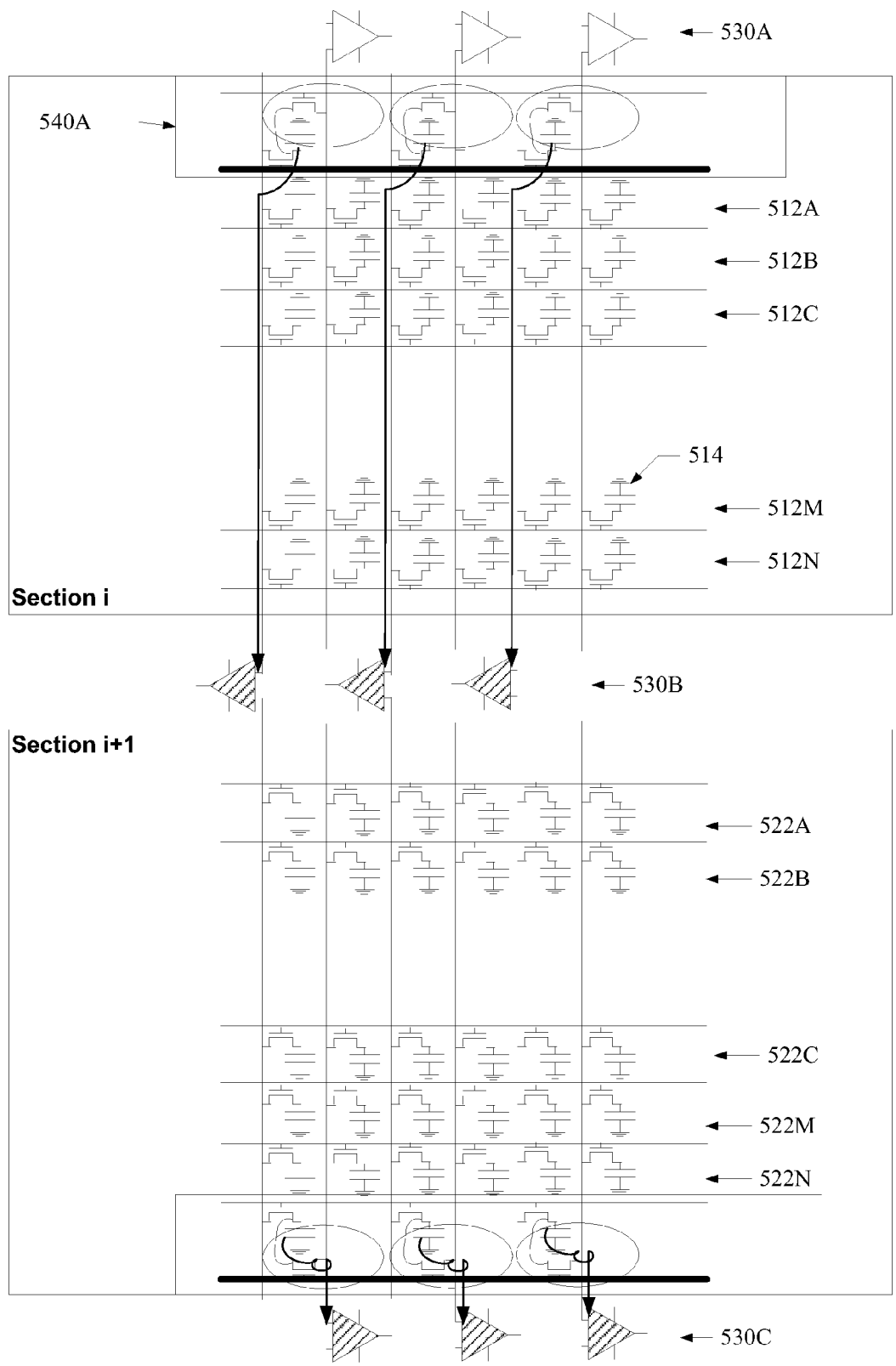
Figure 5D:
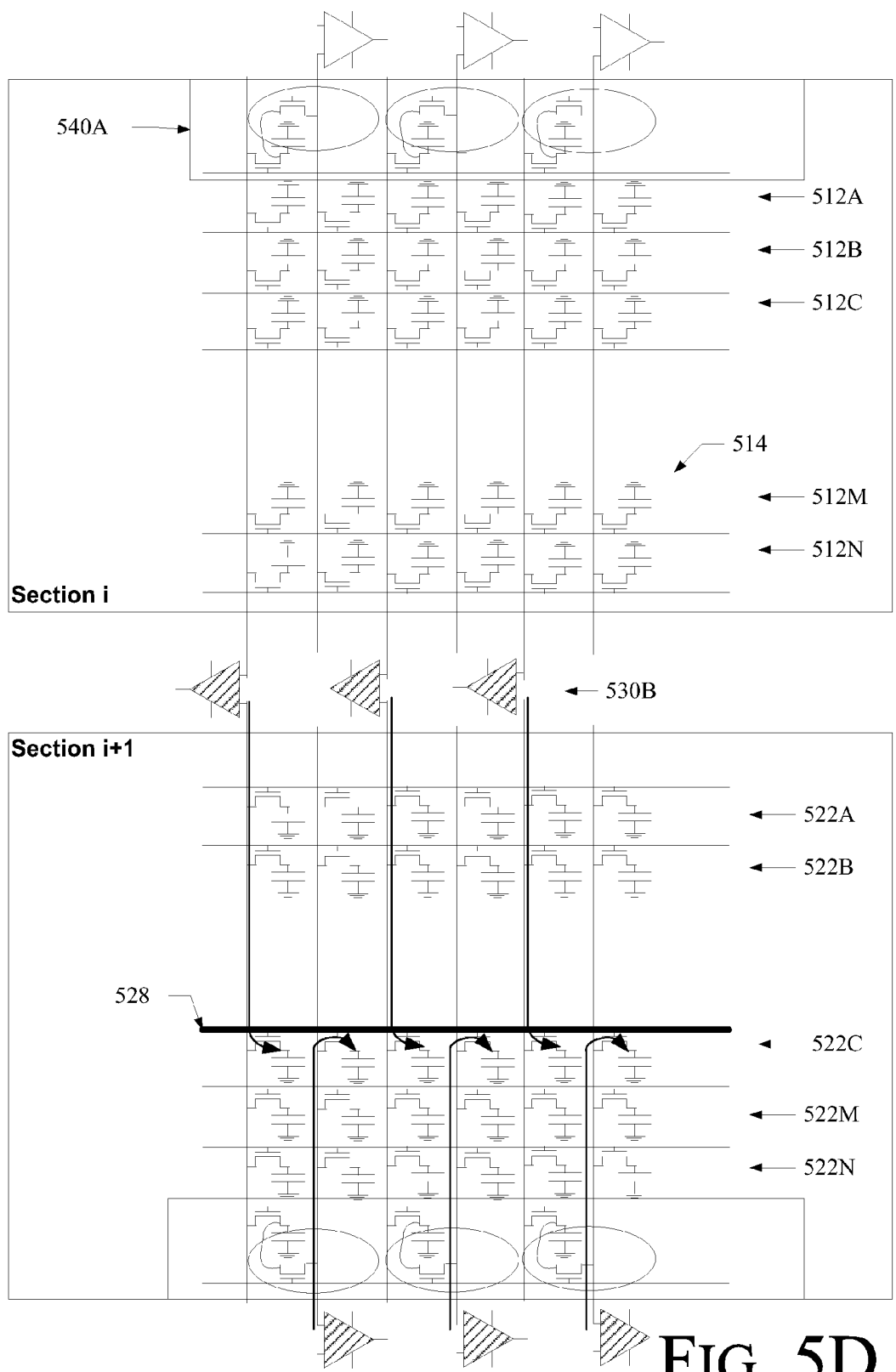

Referring first to FIG. 4A, at operation 410 the controller 242 moves a first portion of data from the first row 512C of data into a first set of sense amplifiers 530A and at operation 315 the controller 242 moves a second portion of data from the first row of data into a second set of sense amplifiers 530B. By way of example, in operation controller 242 may activate word line 518 which causes the data in the memory cells 514 coupled to the even bit lines 516B to be stored in the first set of sense amplifiers 530A and the data in the memory cells 514 coupled to the odd bit lines 516A to be stored in the second set of sense amplifiers 530B.

At operation 420 the controller 242 moves the first portion of data from the first set of sense amplifiers 530A to the first buffer row 540A and at operation 425 the controller 242 moves a second portion of data from the second set of sense amplifiers 530B to the second buffer row 540B. By way of example, referring to FIG. 5B, in operation controller activates the top word line 518 in the first buffer row 540A and the top word line in the second buffer row, 540B, which causes the data from the first set of sense amplifiers to be stored in the memory cells of the first buffer line 540A and the data from the second set of sense amplifiers 530B to be stored in the memory cells of the second buffer row 540B.

At operation 430 the controller 242 moves the second portion of data from the second buffer row 540B to a third set of sense amplifiers 530C and at operation 435 the controller 242 moves the first portion of data from the first buffer row 540A to the second set of sense amplifiers 530B. By way of example, referring to FIG. 5C, in operation controller 242 activates the bottom word line 518 in the first buffer row 540A and the bottom word line in the second buffer row, 540B, which causes the data from the memory cells of the first buffer row 540A to be stored in the second set of sense amplifiers 530B and the data from the memory cells of the second buffer row 540B to be stored in the third set of sense amplifiers 530C.

At operation 440 the controller 242 moves the first portion of data from the second set of sense amplifiers 530B to the second row 522C in the second section 520 of the memory device 500, and at operation 445 the controller 242 moves the second portion of data from the third set of sense amplifiers 530C to the second row 522C in the second section of the memory device. By way of example, referring to FIG. 5D, in operation controller 242 activates the bottom word line 528 in the second section which is to receive the data, which causes the data from the second set of sense amplifiers 530B the third set of sense amplifiers 530C to be stored in the word line 528 in the second section.

Thus, executing operations 410-445 moves the data in the first row 518 of the first memory section 510 to the second row 528 in the second section 520. One skilled in the art will recognize that the process may be repeated to continue moving data between successive sections of the memory device 500. Further, it will be recognized that data in adjacent memory cells are flip-flopped during the process of moving data from the first section 510 to the second section. Thus, data that is moved an odd number of times will have adjacent bits flip-flopped. In some examples the memory device may set a flag to track whether the data has been moved an odd number of times. Thus, if at operation 450 the data has been moved an odd number of times a complement flag may be set (operation 455). By contrast, if at operation 450 the data has been moved an odd number of times a complement flag may not be set (operation 460). The complement flag may be stored in memory in association with the word line to which the data has been moved.

Figure 4B:
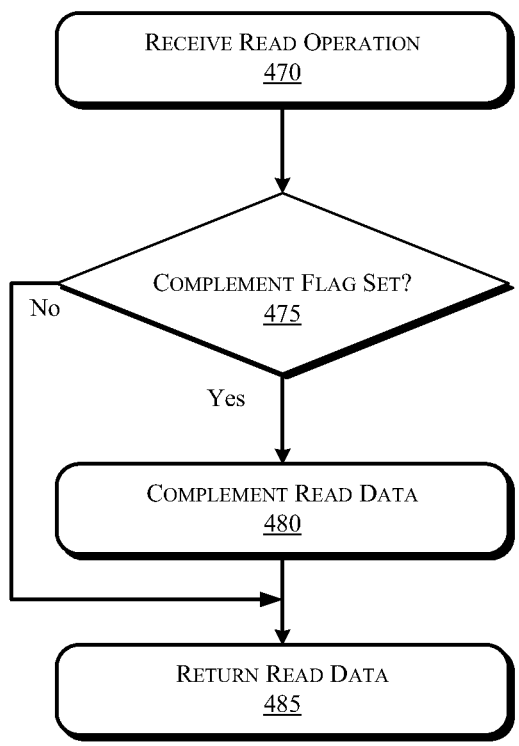

The complement flag may be used to ensure data integrity in subsequent read operations directed to the word line containing data which been moved. Referring to FIG. 4B, at operation 470 a read operation is received that calls for data in a word line 518 which has been moved. If, at operation 475 the complement flag is set then control passes to operation 480 and the controller generates the complement of the data retrieved for the read operation. Control then passes to operation 485 and the read data is returned. By contrast, at operation 475 the complement flag is not set then control passes to directly to operation 485.

Figure 6:
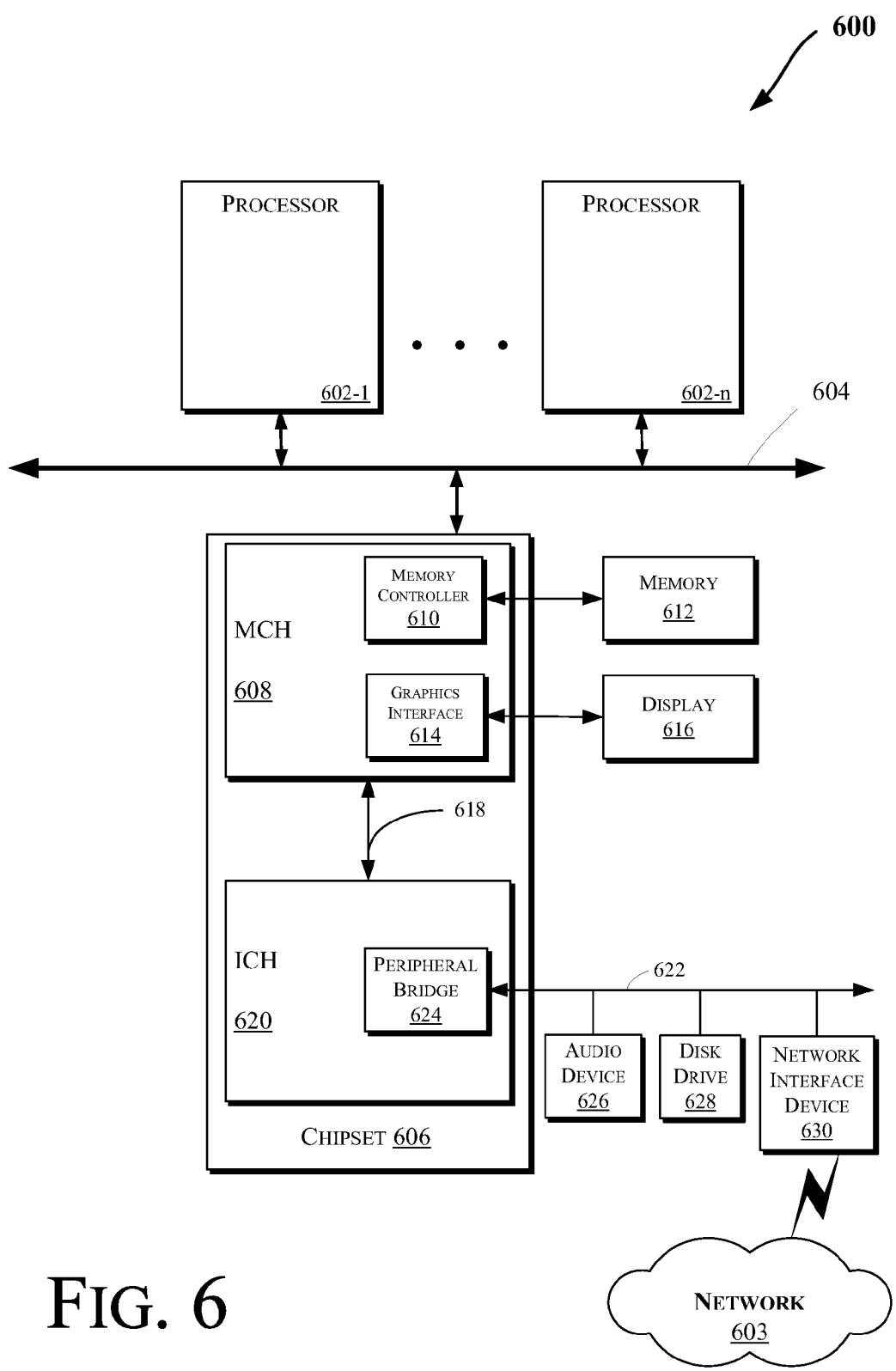
FIGS. 6-10 are schematic, block diagram illustrations of electronic devices which may be adapted to implement a memory broadcast command in accordance with various embodiments discussed herein.

As described above, in some embodiments the electronic device may be embodied as a computer system. FIG. 6 illustrates a block diagram of a computing system 600 in accordance with an embodiment of the invention. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processors 102 of FIG. 1. For example, one or more of the processors 602 may include the control unit 120 discussed with reference to FIGS. 1-3. Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the CPU 602, or any other device included in the computing system 600. In one embodiment of the invention, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple CPUs and/or multiple system memories.

The MCH 608 may also include a graphics interface 614 that communicates with a display device 616. In one embodiment of the invention, the graphics interface 614 may communicate with the display device 616 via an accelerated graphics port (AGP). In an embodiment of the invention, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and one or more other components discussed herein may be combined to form a single chip (e.g., to provide a System on Chip (SOC)). Furthermore, the graphics accelerator 616 may be included within the MCH 608 in other embodiments of the invention.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
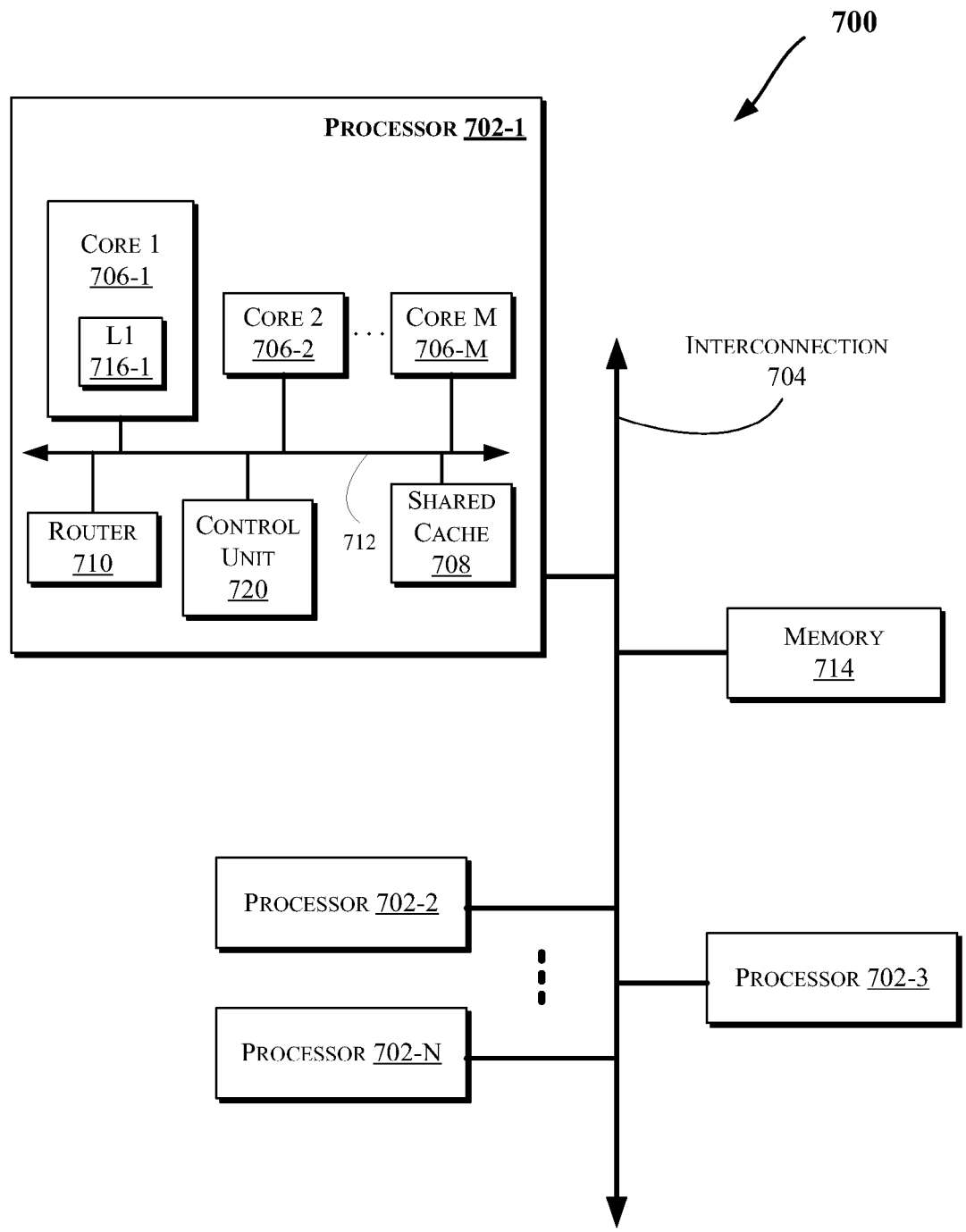

FIG. 7 illustrates a block diagram of a computing system 700, according to an embodiment of the invention. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an embodiment, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one embodiment, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an embodiment, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some embodiments, one or more of the cores 706 may include a level 1 (L1) cache 716-1 (generally referred to herein as "L1 cache 716"). In one embodiment, the control unit 720 may include logic to implement the operations described above with reference to the memory controller 122 in FIG. 2.

Figure 8:
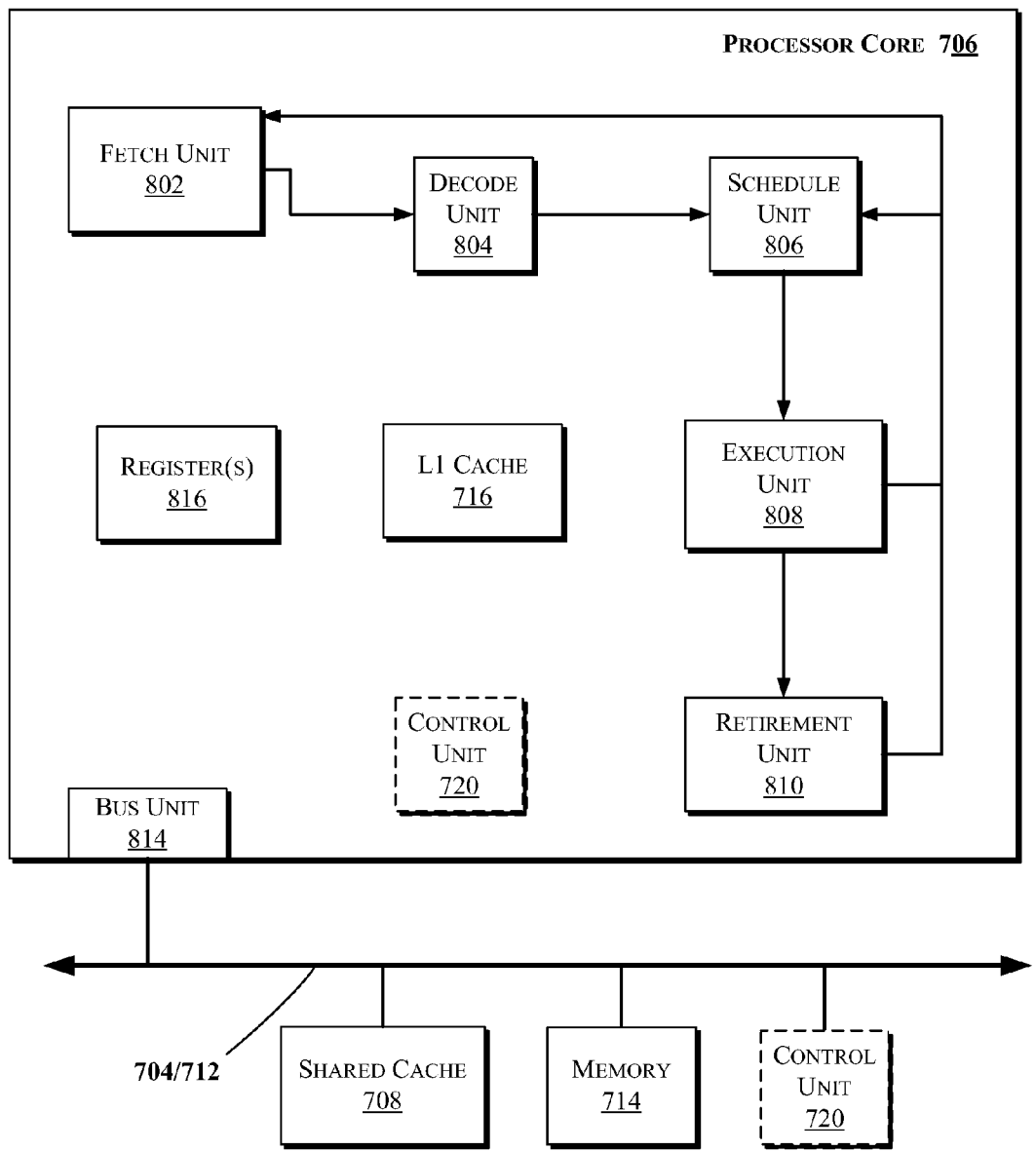

FIG. 8 illustrates a block diagram of portions of a processor core 706 and other components of a computing system, according to an embodiment of the invention. In one embodiment, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction.

For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one embodiment, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an embodiment, the execution unit 808 may include more than one execution unit. The execution unit 808 may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit 808.

Further, the execution unit 808 may execute instructions out-of-order. Hence, the processor core 706 may be an out-of-order processor core in one embodiment. The core 706 may also include a retirement unit 810. The retirement unit 810 may retire executed instructions after they are committed. In an embodiment, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various embodiments the control unit 720 may be located elsewhere such as inside the core 706, coupled to the core via bus 704, etc.

Figure 9:
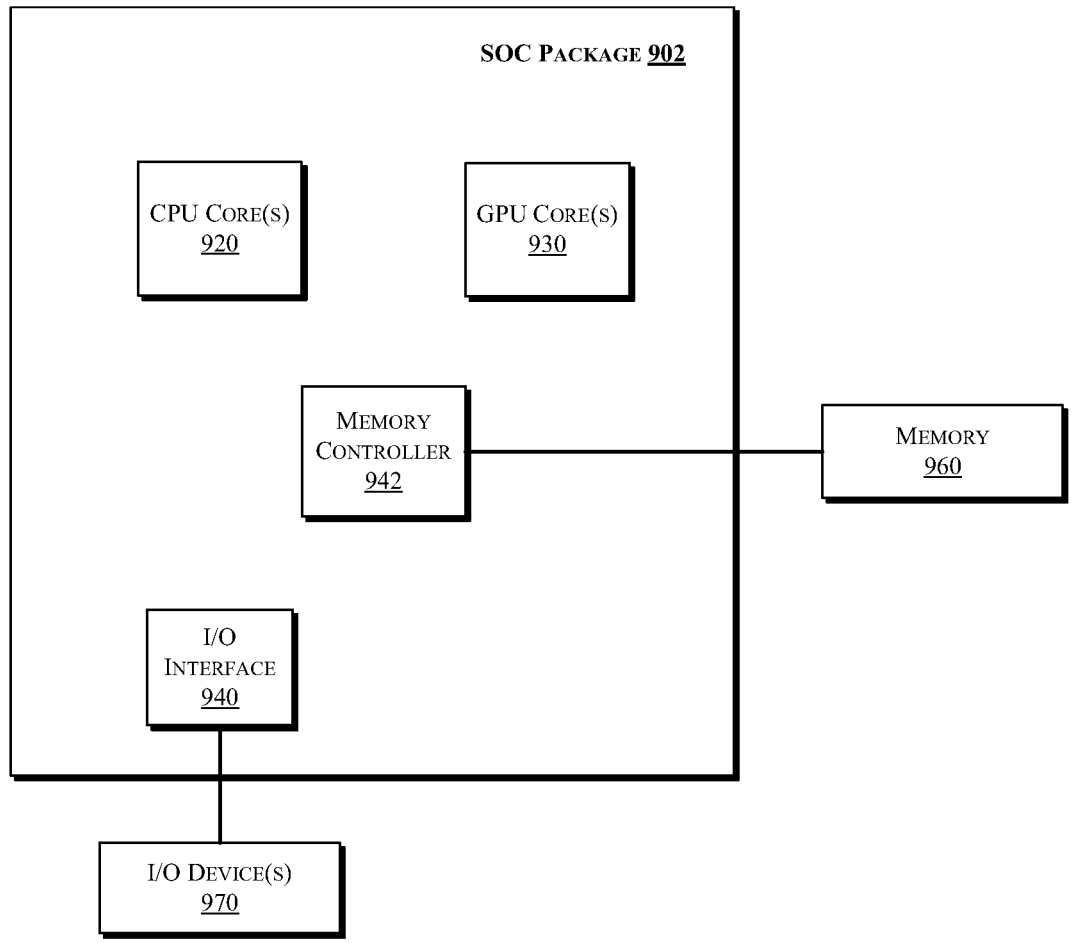

In some embodiments, one or more of the components discussed herein can be embodied as a System On Chip (SOC) device. FIG. 9 illustrates a block diagram of an SOC package in accordance with an embodiment. As illustrated in FIG. 9, SOC 902 includes one or more Central Processing Unit (CPU) cores 920, one or more Graphics Processor Unit (GPU) cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one embodiment, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an embodiment, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch screen, a speaker, or the like.

Figure 10:
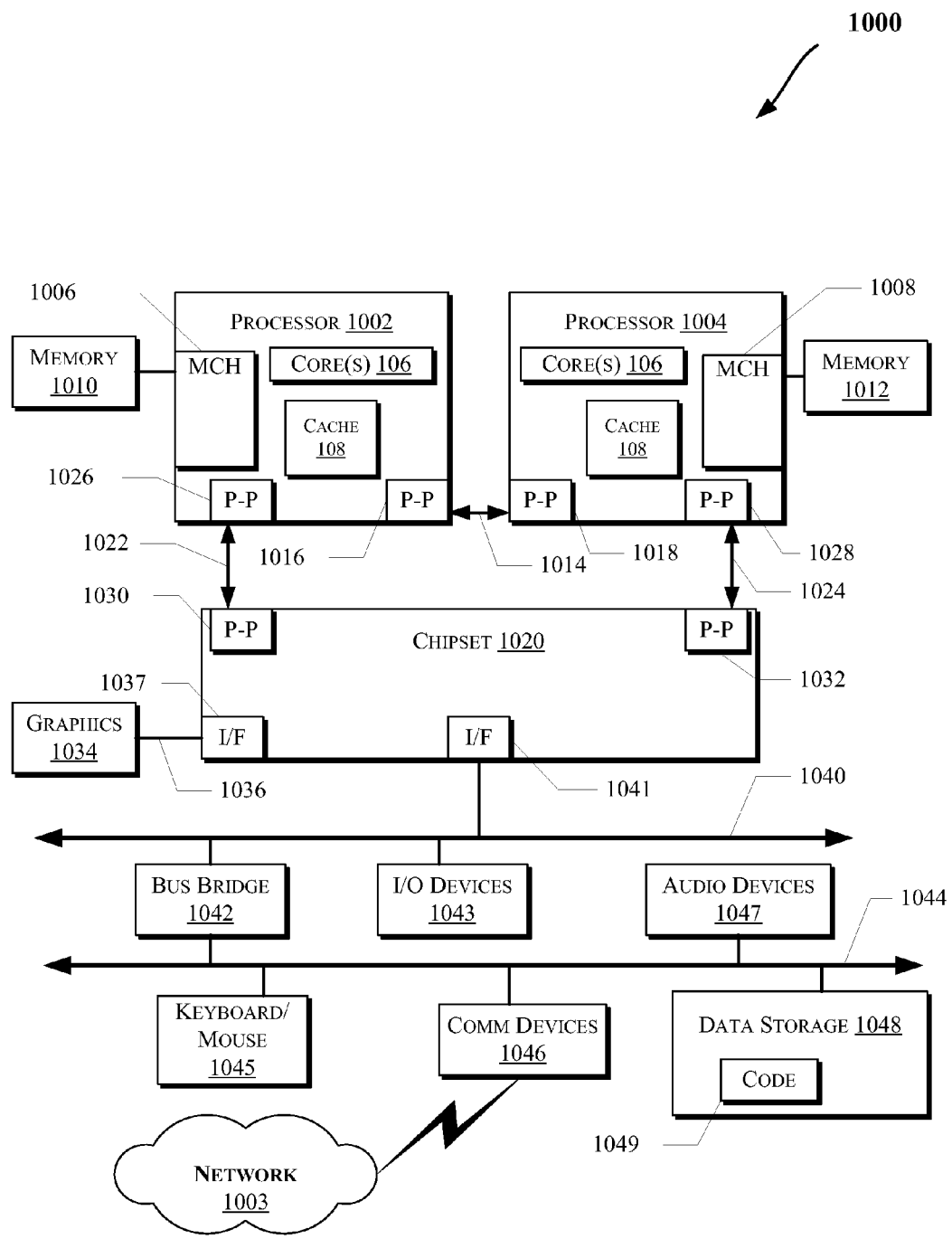

FIG. 10 illustrates a computing system 1000 that is arranged in a point-to-point (PtP) configuration, according to an embodiment of the invention. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic of FIG. 1 in some embodiments.

In an embodiment, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 902 and 904. Other embodiments of the invention, however, may exist in other circuits, logic units, or devices within the system 900 of FIG. 9. Furthermore, other embodiments of the invention may be distributed throughout several circuits, logic units, or devices illustrated in FIG. 9.

The chipset 920 may communicate with a bus 940 using a PtP interface circuit 941. The bus 940 may have one or more devices that communicate with it, such as a bus bridge 942 and I/O devices 943. Via a bus 944, the bus bridge 943 may communicate with other devices such as a keyboard/mouse 945, communication devices 946 (such as modems, network interface devices, or other communication devices that may communicate with the computer network 803), audio I/O device, and/or a data storage device 948. The data storage device 948 (which may be a hard disk drive or a NAND flash based solid state drive) may store code 949 that may be executed by the processors 902 and/or 904.

The following examples pertain to further embodiments.

Example 1 is a controller 242 comprising logic to move a row of data from a first row 512C of a memory in a first section 510 of a memory device 500 to a second row 522C of memory in a second section 520 of the memory device 500 without passing the data through a communication interface 244.

In Example 2, the subject matter of Example 1 can optionally include logic to move a first portion of data from the first row 512C of data into a first set of sense amplifiers 530A and a second portion of data from the first row of data into a second set of sense amplifiers 530B.

In Example 3, the subject matter of any one of Examples 1-2 can optionally include logic to move the first portion of data from the first set of sense amplifiers 530A to a first buffer row 540A comprising a plurality of memory cells, wherein the memory cells in the first buffer row 540A are coupled to two adjacent bit lines 516A, 516B, move the second portion of data from the second set of sense amplifiers 530B to a second buffer row 540B comprising a plurality of memory cells, wherein the memory cells in the second buffer row 540B are coupled to two adjacent bit lines 526A, 526B.

In Example 4, the subject matter of any one of Examples 1-3 can optionally include logic to move the second portion of data from the second buffer row 540B to a third set of sense amplifiers 530C, move the first portion of data from the first buffer row 540A to the second set of sense amplifiers 530B.

In Example 5, the subject matter of any one of Examples 1-4 can optionally include logic move the first portion of data from the second set of sense amplifiers 530B to the second row 522C in the second section 520 of the memory device 500; and move the second portion of data from the third set of sense amplifiers 530C to the second row 522C in the second section of the memory device.

In Example 6, the subject matter of any one of Examples 1-5 can optionally include logic to receive a read command to read the data from the second row 522C and return, in response to the read command, a complement of the data from the second row.

Example 7 is a memory device, comprising at least one memory chip comprising a plurality of rows of memory cells organized into a plurality of sections 510, 520, a controller 242 coupled to the at least one memory chip and comprising logic to move a row of data from a first row 512C of a memory in a first section 510 of a memory device 500 to a second row 522C of memory in a second section 520 of the memory device 500 without passing the data through a communication interface 244.

In Example 8, the subject matter of Example 7 can optionally include logic to move a first portion of data from the first row 512C of data into a first set of sense amplifiers 530A and a second portion of data from the first row of data into a second set of sense amplifiers 530B.

In Example 9, the subject matter of any one of Examples 7-8 can optionally include logic to move the first portion of data from the first set of sense amplifiers 530A to a first buffer row 540A comprising a plurality of memory cells, wherein the memory cells in the first buffer row 540A are coupled to two adjacent bit lines 516A, 516B, move the second portion of data from the second set of sense amplifiers 530B to a second buffer row 540B comprising a plurality of memory cells, wherein the memory cells in the second buffer row 540B are coupled to two adjacent bit lines 526A, 526B.

In Example 10, the subject matter of any one of Examples 7-9 can optionally include logic to move the second portion of data from the second buffer row 540B to a third set of sense amplifiers 530C, move the first portion of data from the first buffer row 540A to the second set of sense amplifiers 530B.

In Example 11, the subject matter of any one of Examples 7-10 can optionally include logic move the first portion of data from the second set of sense amplifiers 530B to the second row 522C in the second section 520 of the memory device 500; and move the second portion of data from the third set of sense amplifiers 530C to the second row 522C in the second section of the memory device.

In Example 12, the subject matter of any one of Examples 7-11 can optionally include logic to receive a read command to read the data from the second row 522C and return, in response to the read command, a complement of the data from the second row.

Example 13 is an electronic device 100 comprising at least one electronic component 122, and a memory device 500, comprising at least one memory chip comprising a plurality of rows of memory cells, a controller coupled to the at least one memory chip and comprising logic to move a row of data from a first row 512C of a memory in a first section 510 of a memory device 500 to a second row 522C of memory in a second section 520 of the memory device 500 without passing the data through a communication interface 244.

In Example 14, the subject matter of Example 13 can optionally include logic to move a first portion of data from the first row 512C of data into a first set of sense amplifiers 530A and a second portion of data from the first row of data into a second set of sense amplifiers 530B.

In Example 15, the subject matter of any one of Examples 13-14 can optionally include logic to move the first portion of data from the first set of sense amplifiers 530A to a first buffer row 540A comprising a plurality of memory cells, wherein the memory cells in the first buffer row 540A are coupled to two adjacent bit lines 516A, 516B, move the second portion of data from the second set of sense amplifiers 530B to a second buffer row 540B comprising a plurality of memory cells, wherein the memory cells in the second buffer row 540B are coupled to two adjacent bit lines 526A, 526B.

In Example 16, the subject matter of any one of Examples 13-15 can optionally include logic to move the second portion of data from the second buffer row 540B to a third set of sense amplifiers 530C, move the first portion of data from the first buffer row 540A to the second set of sense amplifiers 530B.

In Example 17, the subject matter of any one of Examples 13-16 can optionally include logic move the first portion of data from the second set of sense amplifiers 530B to the second row 522C in the second section 520 of the memory device 500; and move the second portion of data from the third set of sense amplifiers 530C to the second row 522C in the second section of the memory device.

In Example 18, the subject matter of any one of Examples 13-17 can optionally include logic to receive a read command to read the data from the second row 522C and return, in response to the read command, a complement of the data from the second row.

Example 19 is a method, comprising moving a row of data from a first row 512C of a memory in a first section 510 of a memory device 500 to a second row 522C of memory in a second section 520 of the memory device 500 without passing the data through a communication interface 244.

In Example 20, the subject matter of Example 19 can optionally include moving a first portion of data from the first row 512C of data into a first set of sense amplifiers 530A and a second portion of data from the first row of data into a second set of sense amplifiers 530B.

In Example 21, the subject matter of any one of Examples 19-20 can optionally include moving the first portion of data from the first set of sense amplifiers 530A to a first buffer row 540A comprising a plurality of memory cells, wherein the memory cells in the first buffer row 540A are coupled to two adjacent bit lines 516A, 516B and moving the second portion of data from the second set of sense amplifiers 530B to a second buffer row 540B comprising a plurality of memory cells, wherein the memory cells in the second buffer row 540B are coupled to two adjacent bit lines 526A, 526B.

In Example 22, the subject matter of any one of Examples 19-21 can optionally include moving the second portion of data from the second buffer row 540B to a third set of sense amplifiers 530C, and moving the first portion of data from the first buffer row 540A to the second set of sense amplifiers 530B.

In Example 23, the subject matter of any one of Examples 19-22 can optionally include moving the first portion of data from the second set of sense amplifiers 530B to the second row 522C in the second section 520 of the memory device 500; and moving the second portion of data from the third set of sense amplifiers 530C to the second row 522C in the second section of the memory device.

In Example 24, the subject matter of any one of Examples 19-23 can optionally include receiving a read command to read the data from the second row 522C and returning, in response to the read command, a complement of the data from the second row.

In various embodiments of the invention, the operations discussed herein, e.g., with reference to FIGS. 1-10, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed herein.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. A controller comprising logic to:
move a row of data from a first row of a memory in a first section of a memory device to a second row of memory in a second section of the memory device without passing the data through a communication interface, where to move the row of data, the controller further comprises logic to:
move a first portion of data from the first row of data into a first set of sense amplifiers; and
move a second portion of data from the first row of data into a second set of sense amplifiers.

2. The controller of claim 1, further comprising logic to:
move the first portion of data from the first set of sense amplifiers to a first buffer row comprising a plurality of memory cells, wherein the memory cells in the first buffer row are coupled to two adjacent bit lines; and
move the second portion of data from the second set of sense amplifiers to a second buffer row comprising a plurality of memory cells, wherein the memory cells in the second buffer row are coupled to two adjacent bit lines.

3. The controller of claim 2, further comprising logic to:
move the second portion of data from the second buffer row to a third set of sense amplifiers; and
move the first portion of data from the first buffer row to the second set of sense amplifiers.

4. The controller of claim 3, further comprising logic to:
move the first portion of data from the second set of sense amplifiers to the second row in the second section of the memory device; and
move the second portion of data from the third set of sense amplifiers to the second row in the second section of the memory device.

5. The controller of claim 1, further comprising logic to:
receive a read command to read the data from the second row; and
return, in response to the read command, a complement of the data from the second row.

6. A memory device, comprising:
at least one memory chip comprising a plurality of rows of memory cells organized into a plurality of sections; and
a controller coupled to the at least one memory chip and comprising logic to:
move a row of data from a first row of a memory in a first section of a memory device to a second row of memory in a second section of the memory device without passing the data through a communication interface, where to move the row of data, the controller further comprises logic to:
move a first portion of data from the first row of data into a first set of sense amplifiers; and
move a second portion of data from the first row of data into a second set of sense amplifiers.

7. The memory device of claim 6, wherein the controller further comprises logic to:
move the first portion of data from the first set of sense amplifiers to a first buffer row comprising a plurality of memory cells, wherein the memory cells in the first buffer row are coupled to two adjacent bit lines; and
move the second portion of data from the second set of sense amplifiers to a second buffer row comprising a plurality of memory cells, wherein the memory cells in the second buffer row are coupled to two adjacent bit lines.

8. The memory device of claim 7, wherein the controller further comprises logic to:
move the second portion of data from the second buffer row to a third set of sense amplifiers; and
move the first portion of data from the first buffer row to the second set of sense amplifiers.

9. The memory device of claim 8, wherein the controller further comprises logic to:
move the first portion of data from the second set of sense amplifiers to the second row in the second section of the memory device; and move the second portion of data from the third set of sense amplifiers to the second row in the second section of the memory device.

10. The memory device of claim 6, wherein the controller further comprises logic to:
receive a read command to read the data from the second row; and
return, in response to the read command, a complement of the data from the second row.

11. An electronic device, comprising:
at least one electronic component; and
a memory device, comprising:
at least one memory chip comprising a plurality of rows of memory cells; and
a controller coupled to the at least one memory chip and comprising logic to:
move a row of data from a first row of a memory in a first section of a memory device to a second row of memory in a second section of the memory device without passing the data through a communication interface, where to move the row of data, the controller further comprises logic to:
move a first portion of data from the first row of data into a first set of sense amplifiers; and
move a second portion of data from the first row of data into a second set of sense amplifiers.

12. The electronic device of claim 11, wherein the controller further comprises logic to:
move the first portion of data from the first set of sense amplifiers to a first buffer row comprising a plurality of memory cells, wherein the memory cells in the first buffer row are coupled to two adjacent bit lines; and
move the second portion of data from the second set of sense amplifiers to a second buffer row comprising a plurality of memory cells, wherein the memory cells in the second buffer row are coupled to two adjacent bit lines.

13. The electronic device of claim 12, wherein the controller further comprises logic to:
move the second portion of data from the second buffer row to a third set of sense amplifiers; and
move the first portion of data from the first buffer row to the second set of sense amplifiers.

14. The electronic device of claim 13, wherein the controller further comprises logic to:
move the first portion of data from the second set of sense amplifiers to the second row in the second section of the memory device; and
move the second portion of data from the third set of sense amplifiers to the second row in the second section of the memory device.

15. The electronic device of claim 11, wherein the controller further comprises logic to:
receive a read command to read the data from the second row; and
return, in response to the read command, a complement of the data from the second row.

16. A method, comprising:
moving a row of data from a first row of a memory in a first section of a memory device to a second row of memory in a second section of the memory device without passing the data through a communication interface, where to move the row of data, the controller further comprises logic to:
move a first portion of data from the first row of data into a first set of sense amplifiers; and
move a second portion of data from the first row of data into a second set of sense amplifiers.

17. The method of claim 16, further comprising:
moving the first portion of data from the first set of sense amplifiers to a first buffer row comprising a plurality of memory cells, wherein the memory cells in the first buffer row are coupled to two adjacent bit lines; and
moving the second portion of data from the second set of sense amplifiers to a second buffer row comprising a plurality of memory cells, wherein the memory cells in the second buffer row are coupled to two adjacent bit lines.

18. The method of claim 17, further comprising:
moving the second portion of data from the second buffer row to a third set of sense amplifiers; and
moving the first portion of data from the first buffer row to the second set of sense amplifiers.

19. The method of claim 18, further comprising:
moving the first portion of data from the second set of sense amplifiers to the second row in the second section of the memory device; and
moving the second portion of data from the third set of sense amplifiers to the second row in the second section of the memory device.

20. The method of claim 16, further comprising:
receiving a read command to read the data from the second row; and
returning, in response to the read command, a complement of the data from the second row.

* * * * *